(12) United States Patent
Banerjee et al.

(10) Patent No.: US 6,566,757 B1
(45) Date of Patent: May 20, 2003

(54) STABILIZATION OF LOW DIELECTRIC CONSTANT FILM WITH IN SITU CAPPING LAYER

(75) Inventors: Indrajit Banerjee, San Jose, CA (US); Lawrence D. Wong, Beaverton, OR (US); Marnie L. Harker, Campbell, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/516,650

(22) Filed: Mar. 1, 2000

Related U.S. Application Data

(62) Division of application No. 09/201,580, filed on Nov. 30, 1998, now abandoned.

(51) Int. Cl.[7] .................. H01L 23/48; H01L 23/52; H01L 29/40
(52) U.S. Cl. .................. 257/758; 257/759; 257/760
(58) Field of Search .................. 257/758–759, 257/760; 438/624–635

(56) References Cited

U.S. PATENT DOCUMENTS

| | | | | |
|---|---|---|---|---|
| 4,946,550 A | * | 8/1990 | Van Laarhoven | 438/631 |
| 5,432,128 A | * | 7/1995 | Tsu | 438/635 |
| 5,677,239 A | * | 10/1997 | Isobe | 438/633 |
| 5,753,564 A | | 5/1998 | Fukada | |
| 5,888,905 A | | 3/1999 | Taylor et al. | |
| 5,937,323 A | | 8/1999 | Orczyk et al. | |
| 6,054,380 A | * | 4/2000 | Naik | 438/624 |
| 6,166,439 A | * | 12/2000 | Cox | 257/758 |
| 6,218,299 B1 | * | 4/2001 | Akahori et al. | 438/682 |
| 6,227,817 B1 | * | 5/2001 | Paden | 417/356 |

OTHER PUBLICATIONS

Endo, K, "Fluorinated Amorphous Carbon as a Low–Dielectric–Constant Interlayer Dielectric", MRS Bulletin/ Oct. 1997, pp. 55–58.

* cited by examiner

*Primary Examiner*—Cuong Quang Nguyen
(74) *Attorney, Agent, or Firm*—Blakely, Sokoloff, Taylor & Zafman LLP

(57) ABSTRACT

An interconnect structure for microelectronic devices includes interconnect lines having dielectric material disposed therebetween as an intralayer dielectric, and a capping structure, also disposed between the interconnect lines, that reduces outgassing from the material. Typical embodiments include fluorinated dielectric materials, such as amorphous fluorinated carbon. The capping structure also acts as a moisture barrier to prevent moisture from penetrating into the fluorinated material and combining therewith to produce corrosive chemicals. The capping structure is formed in-situ so that the fluorinated dielectric material is not exposed to moisture prior to the formation of the capping structure.

9 Claims, 8 Drawing Sheets

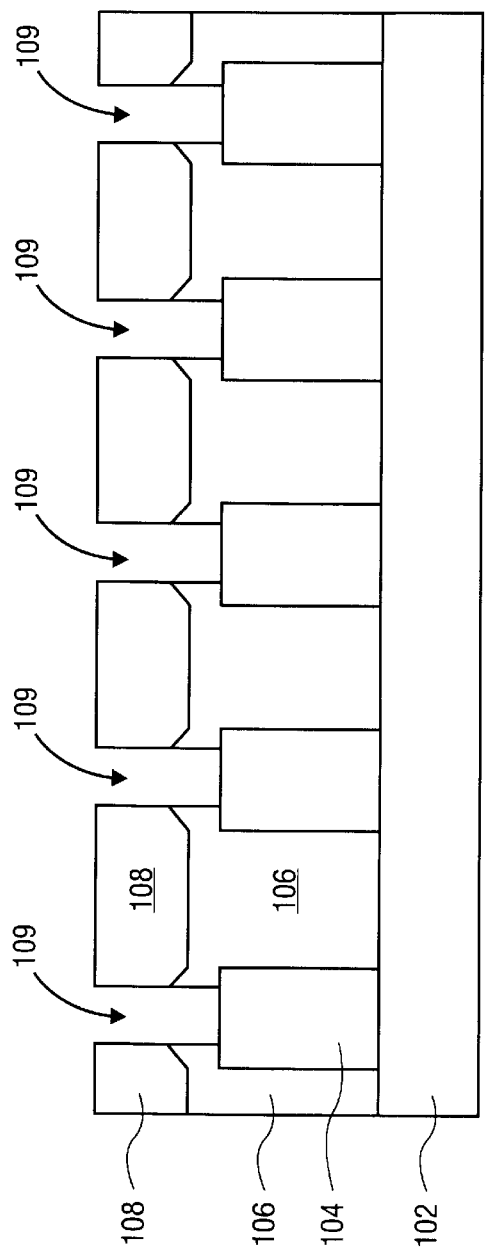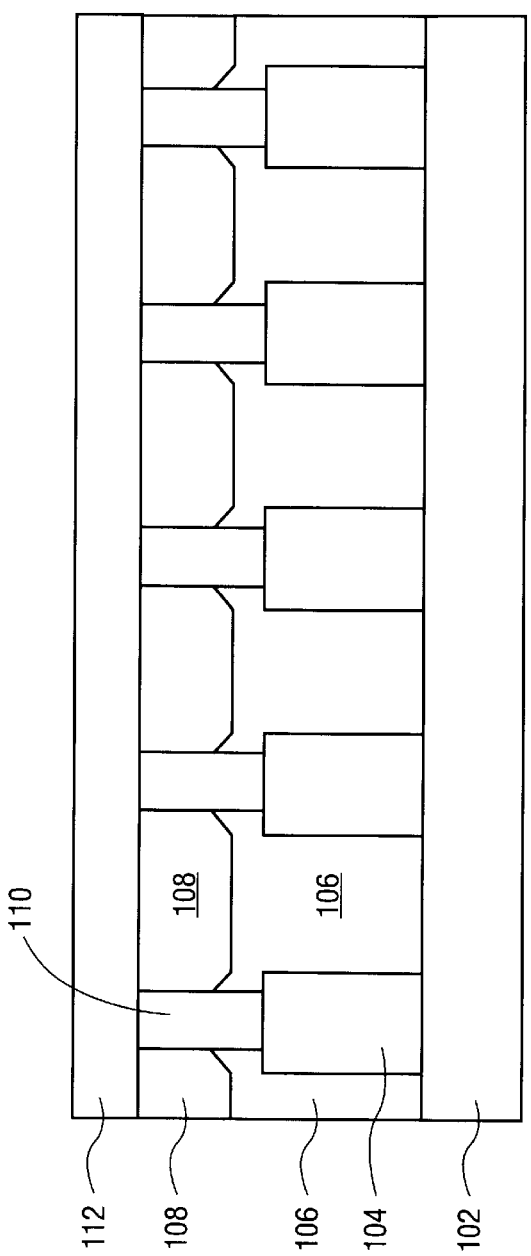

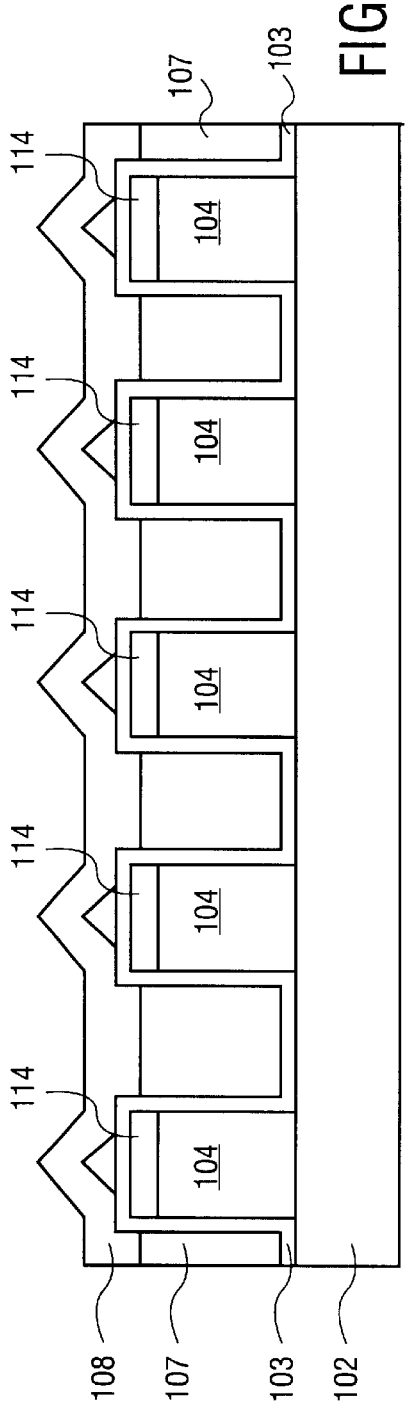
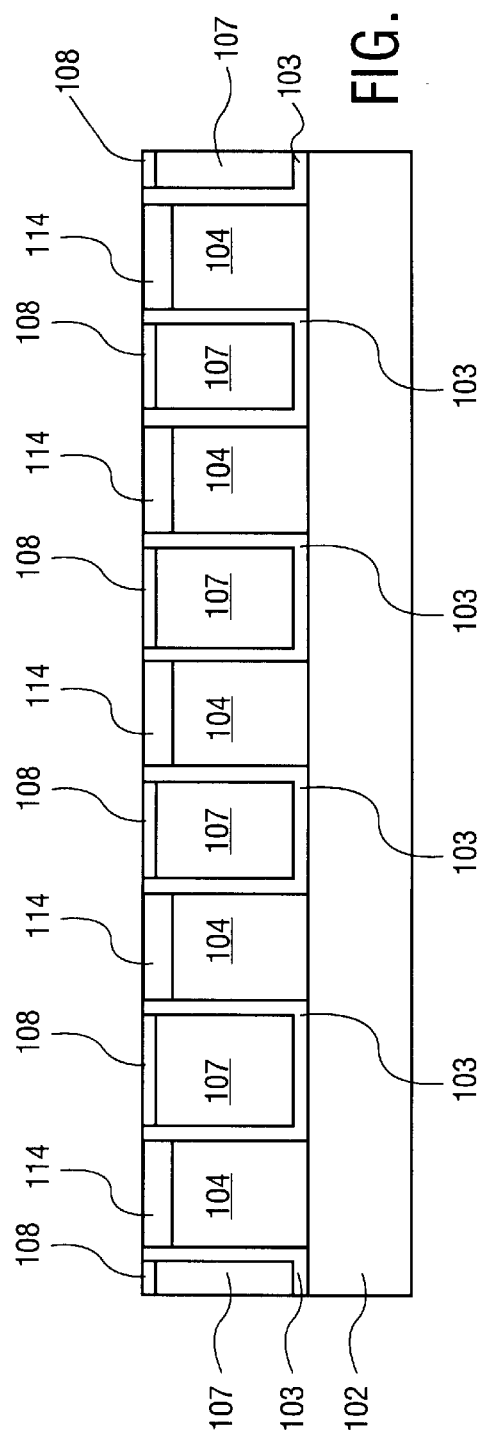

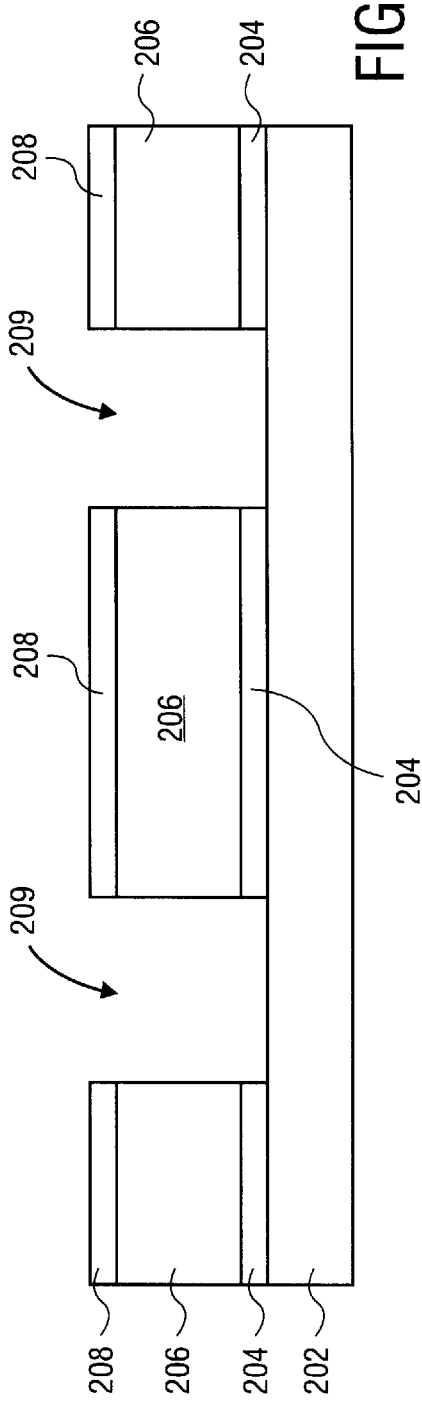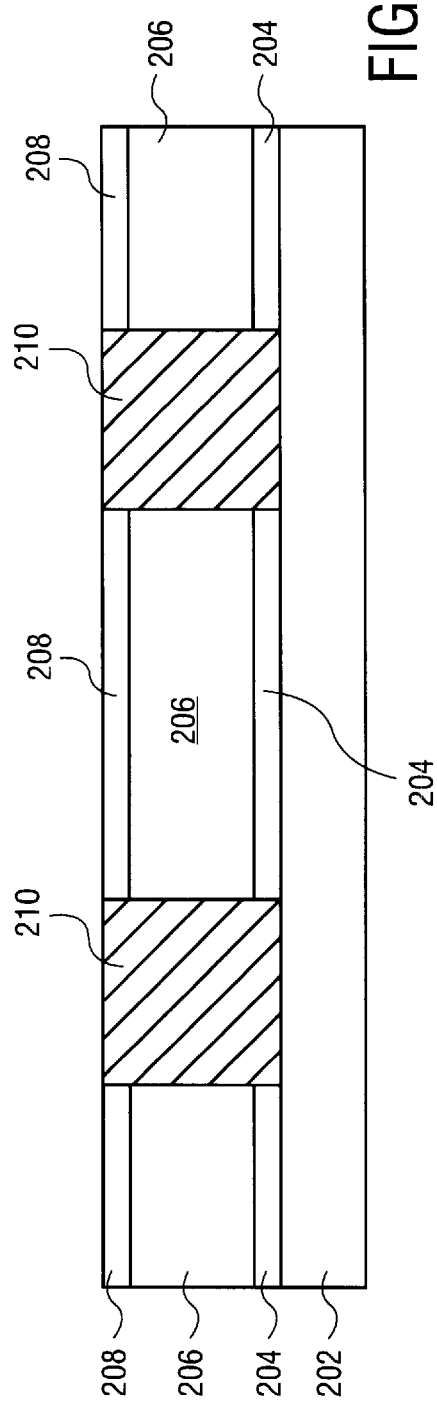

US 6,566,757 B1

STABILIZATION OF LOW DIELECTRIC CONSTANT FILM WITH IN SITU CAPPING LAYER

This is a divisional application of Ser. No. 09/201,580, filed Nov. 30, 1998, now abandoned.

BACKGROUND OF THE INVENTION

1. Field of the Invention

The present invention relates generally to microelectronic structures and fabrication methods, and more particularly to the formation of interconnect insulation having low dielectric constants.

2. Background

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as silicon dioxide.

A consequence of having of patterned conductive material separated by an insulating material, whether the conductive material is on a single level or multiple levels, is the formation of undesired capacitors. The parasitic capacitance between patterned conductive material, or more simply, interconnects, separated by insulating material on microelectronic devices contributes to effects such as RC delay, power dissipation, and capacitively coupled signals, also known as cross-talk.

One way to reduce the unwanted capacitance between the interconnects is to increase the distance between them. Increased spacing between interconnect has adverse consequences such as increased area requirements, and corresponding increases in manufacturing costs. Another way to reduce the unwanted capacitance between the interconnects is to use an insulating material with a lower dielectric constant.

What is needed is a structure providing low parasitic capacitance between patterned conductors, and methods of making such a structure.

SUMMARY OF THE INVENTION

Briefly, an interconnect structure for microelectronic devices includes interconnect lines having dielectric material disposed therebetween as an intralayer dielectric and an encapsulation structure, also disposed between the interconnect lines, that reduces outgassing from the dielectric material.

In one particular embodiment of the present invention, the dielectric material is an amorphous fluorinated carbon, and the encapsulation structure includes a moisture resistant capping layer that is formed in situ.

BRIEF DESCRIPTION OF THE DRAWINGS

FIG. 3 is a schematic cross-section of the structure of FIG. 2 subsequent to the formation of via openings.

FIG. 4 is a schematic cross-section of the structure of FIG. 3 showing the via openings after plug formation, and upper level metallization.

FIG. 8 is a schematic cross-section of an alternative embodiment of the present invention showing interconnect lines formed on an insulating substrate and having a hardmask layer on the top surfaces thereof, with a liner layer deposited over and between the interconnect lines, a low-k film deposited over the liner layer, and an in-situ deposited capping layer formed over the low-k film.

FIG. 9 is a schematic cross-section of the structure of FIG. 7 after a planarization operation.

FIG. 10 is a schematic cross-section of a portion of a wafer having a low-k material with an underlying liner, and an in-situ deposited capping layer, after trench patterning for a damascene interconnect line formation process.

FIG. 11 is a schematic cross-section showing the structure of FIG. 10 after metal has been deposited and polished to form interconnect lines.

DETAILED DESCRIPTION

Terminology

Figure 1:
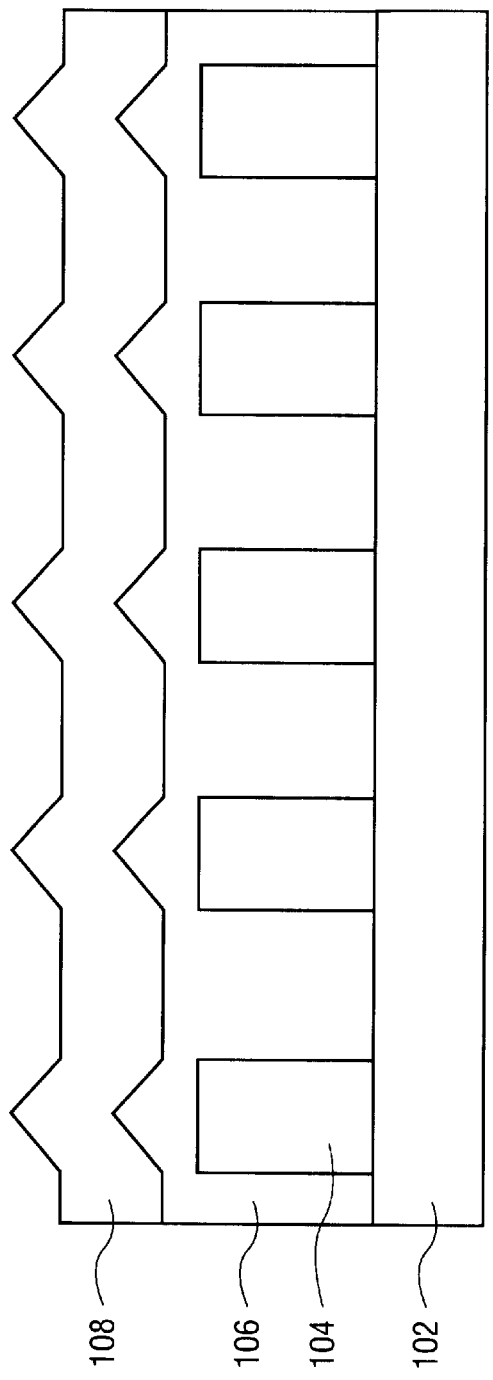
FIG. 1 is a schematic cross-section of a portion of a wafer showing interconnect lines formed on an insulating substrate with a low-k film deposited over and between the interconnect lines, and a silicon dioxide layer formed over the low-k film.

The terms, chip, integrated circuit, monolithic device, semiconductor device, and microelectronic device, are often used interchangeably in this field.

The present invention is applicable to all the above as they are generally understood in the field.

The terms metal line, interconnect line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), cobalt (Co), nickel (Ni), tungsten (W), and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The expression, low dielectric constant material, refers to materials having a lower dielectric constant than oxides of silicon. For example, organic polymers, amorphous fluorinated carbons, nanofoams, silicon based insulators containing organic polymers, and fluorine containing oxides of silicon have lower dielectric constants than silicon dioxide.

The letter k, is often used to refer to dielectric constant. Similarly, the terms high-k, and low-k, are used in this field to refer to high dielectric constant and low dielectric constant respectively.

The term intralayer dielectric as used in this field is understood to refer to the dielectric material disposed between interconnect lines on a given interconnect level. That is, an intralayer dielectric is found between adjacent interconnect lines, rather than vertically above or below those interconnect lines.

HDP refers to high density plasma.

PECVD refers to plasma enhanced chemical vapor deposition.

The term vertical, as used herein, means substantially perpendicular to the surface of a substrate.

Overview

The parasitic capacitance seen by an interconnect line is a function of the distance to another conductor and the dielectric constant of the material therebetween.

In order to manufacture integrated circuits with low parasitic capacitance between interconnect lines, it is desirable to electrically isolate the conductors from each other with an insulator having a low dielectric constant. Amorphous fluorinated carbon (a-F:C) and amorphous fluorinated hydrocarbon (a-F:C:H) have recently been used as intralayer dielectrics to reduce parasitic capacitance between interconnect lines by providing a low-k dielectric material as an insulator between those interconnect lines.

Unfortunately, low-k a-F:C and a-F:C:H dielectric films deposited by HDP or PECVD techniques are potentially unstable with respect to outgassing during subsequent thermal processing. Often these films are not stable above 300 degrees C and may require a curing or anneal operation to help stabilize the film. As a result, F, HF, CHx, CFx, or even CO and $CO_2$ may be evolved from this elevated temperature operation. This outgassing problem is greatly exacerbated by interactions with moisture either while at room temperature or in subsequent film processing. The majority composition of these CVD films are amorphous and have compositions seen to be $C_2F$ (e.g., approximately 33% F and 66% C). $C_2F$ in the crystalline form of graphite fluoride is reported to have a thermal stability of 590° C. in vacuum, 570° C. in Ar and 300° C. in $Cl_2$.

Some semiconductor manufacturing processes use a non-sequentially applied capping layer such as an oxide layer, a Si-rich oxide layer, a SiN layer, a SiC layer, an a-C:H layer, or a combination thereof. However, none of these capping layers are especially good barriers against HF attack. Additionally, none of these capping layers are able to withstand significant film outgassing from the low-k dielectric film once moisture interaction has taken place.

In embodiments of the present invention, in-situ deposition of a capping layer provides an effective moisture barrier for low-k intralayer dielectric films such as a-F:C, and a-F:C:H. The encapsulation of the low-k intralayer dielectric films may be done by way of CVD or reactive sputter depositions. The capping layer can be any suitable electrically insulating material that forms a good moisture barrier for low-k intralayer dielectric films.

FIGS. 1–4 illustrate a problematic approach to providing a low-k insulating material between interconnect lines.

Referring now to FIG. 1, a layer of conductive material is deposited onto the surface of a substrate 102 and then patterned to provide interconnect lines 104, as shown in FIG. 1. It will be appreciated that FIG. 1 is a schematic representation of a partially completed wafer. As such, substrate 102 may be viewed as representing all the underlying layers that may be found in a wafer that has reached the metallization stage of fabrication. An intralayer dielectric 106 is then formed over the surface of the wafer, filling the gaps between interconnect lines 104. Intralayer dielectric 106 may be an amorphous fluorinated carbon. Intralayer dielectric 106 generally fills the space between and above interconnect lines 104. An interlayer dielectric film 108 is then conformally deposited over intralayer dielectric 106.

Figure 2:
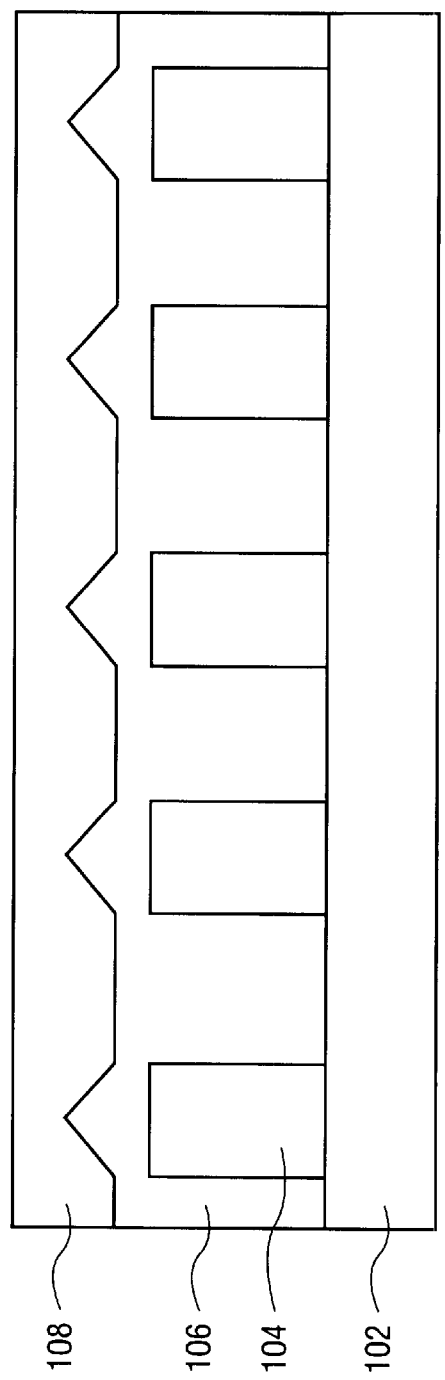
FIG. 2 is a schematic cross-section of the structure of FIG. 1 after a planarization operation.

As can be seen in FIG. 2, a planarization operation is performed on the interlayer dielectric film 108. Subsequently, via openings 109 are formed through interlayer dielectric 108 and the portions of intralayer dielectric 106 that overlie interconnect lines 104, as shown in FIG. 3. It can be seen that intralayer dielectric 106 is exposed by the process that forms the via opening. After via openings 109 are made, vias 110 are formed therein, and a conductive layer 112 is deposited, as can be seen in FIG. 4.

To overcome the reliability problems associated with a-F:C, an illustrative method in accordance with the present invention provides isolation of the a-F:C from metal interconnects, and further provides an in-situ capping layer to reduce or prevent outgassing of chemicals from the a-F:C. This in-situ layer also acts to reduce or prevent interaction of a-F:C with the ambient that may create additional outgassing. The illustrative method of forming a low dielectric constant intralayer insulating film having a capping layer, in accordance with the present invention, is described below in conjunction with FIGS. 5–7.

Figure 5:
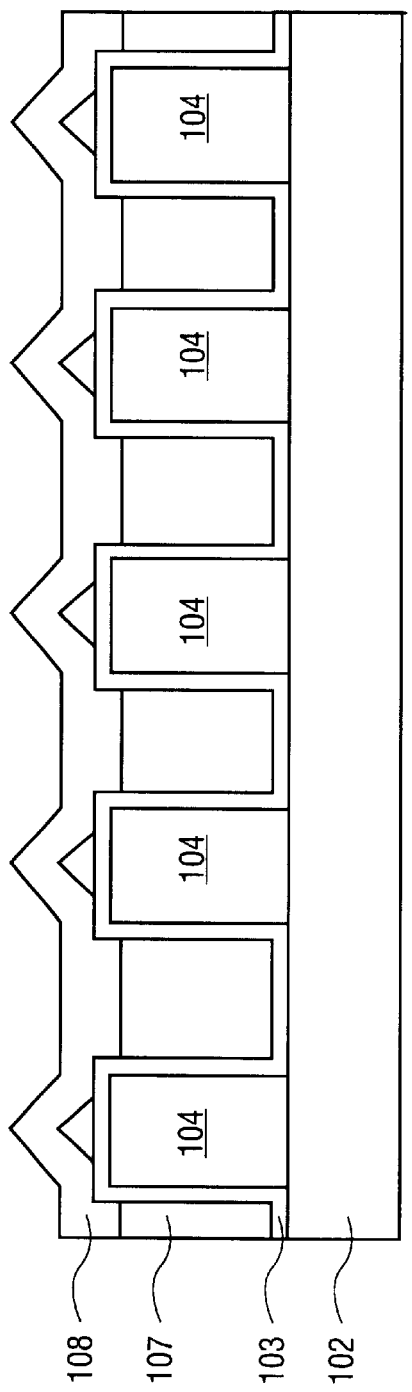
FIG. 5 is a schematic cross-section of a portion of a wafer in accordance with the present invention, showing interconnect lines formed on an insulating substrate with a liner layer deposited over and between the interconnect lines, a low-k film deposited over the liner layer, and an in-situ deposited capping layer formed over the low-k film.

Referring to FIG. 5, a process of forming a low dielectric constant intralayer insulating film having a capping layer in accordance with the present invention is described. Interconnect lines 104 are formed by patterning a conductive layer that has been disposed upon a substrate 102, such as a silicon wafer. The conductive layer is typically formed on an insulating layer covering the silicon wafer, from a metal such as, for example, aluminum, copper, or alloys of these metals. Those skilled in the art will recognize that various other conductive materials may also be used, including but not limited to, tungsten. In this illustrative embodiment of the present invention, the interconnect lines are between approximately 0.5 micron and 1.8 microns in thickness and have of minimum width of greater than or equal to 0.15 micron. The minimum spacing of these metal lines is between approximately 0.15 micron and 0.8 micron. Those skilled in the art having the benefit of this disclosure will appreciate that various combinations of height, width and spacing of interconnect lines are compatible with the embodiments of the present invention.

A liner layer 103 is then formed over the sidewall and topside surfaces of interconnect lines 104, and over the exposed portions of the underlying substrate 102. Liner 103 may be formed by depositing a material such as, but not limited to, silicon nitride, silicon dioxide, SiC, or a-CN. A high density plasma chemical vapor deposition of fluorinated amorphous carbon is then performed to form an a-F:C layer 107. The a-F:C layer 107 has a lower dielectric constant than traditionally used dielectric materials such as silicon dioxide. Note that, as shown in FIG. 5, amorphous fluorinated carbon layer 107 is less thick than layer 106 shown in FIGS. 1–4.

In the illustrative embodiment of the present invention, a high density plasma is a plasma having a density of approximately $10^{13}$–$10^{14}$ ions per square centimeter. In one embodiment of the present invention, the conditions for deposition of amorphous fluorinated carbon layer 107 by HDP CVD include, an rf bias in the range of zero to approximately 2 kilowatts applied to the substrate, a plasma power (microwave or rf) in the range of approximately 2 kilowatts to approximately 5 kilowatts to create the plasma, and at least one fluorocarbon introduced into the reaction chamber between the plasma and the substrate.

Various fluorocarbon and hydrocarbon precursors can be used to form the fluorinated amorphous carbon layer in accordance with the present invention. The fluorocarbon is typically injected into the reaction chamber, as a gas, between the plasma and the substrate, and is generally selected from the group consisting of $C_4F_8$, $C_5F_8$, and $C_6F_6$. The hydrocarbon is typically injected into the reaction chamber, as a gas, between the plasma and the substrate, and is generally selected from the group consisting of $CH_4$, $C_2H_2$, $C_2H_4$, and $C_2H_6$.

Optionally, an annealing operation may be performed subsequent to the formation of fluorinated amorphous carbon layer 107. Such an anneal is performed in the range of approximately 400° C. to approximately 425° C. Those skilled in the art having the benefit of this disclosure will appreciate that specific choices of temperatures and times for the annealing will depend, to some extent, on the overall thermal budget for a particular semiconductor manufacturing process.

Subsequent to the formation the fluorinated amorphous carbon, or subsequent to the anneal operation if one is performed, a capping layer 108 is formed in situ. That is, capping layer 108 is formed over intralayer low-k dielectric 107 in the same, or an adjacent, process chamber such that the vacuum is not broken and the wafer is not exposed to the atmosphere until after capping layer 108 is formed.

A typical thickness for capping layer 108 is in the range of approximately 50 nm to approximately 100 nm. Those skilled in the art will appreciate that the thickness of capping layer 108 will depend on various process integration issues including but not limited to, the material or materials chosen to form capping layer 108 and the properties of these materials with respect to prevention of outgassing and moisture penetration, and the mechanical strength required to support upper layers.

Figure 6:
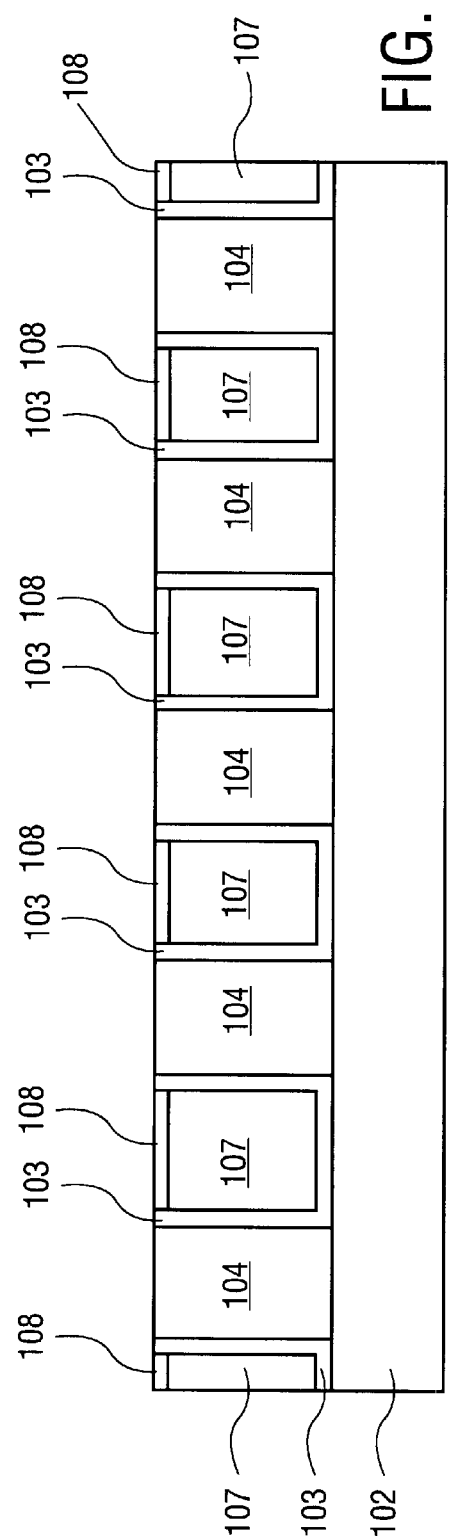
FIG. 6 is a schematic cross-section of the structure of FIG. 5 after a planarization operation.

The structure of FIG. 5 is subjected to a planarization operation to produce the structure shown in FIG. 6. As can be seen in FIG. 6, the intralayer dielectric structure includes low-k dielectric 107, liner 103, which encapsulates the bottom and vertical side surfaces of low-k dielectric 107, and capping layer 108 which encapsulates the top surface of low-k dielectric 107.

With respect to the structure shown in FIG. 6, the top of metal 104 is seen to be exposed after completion of the planarization process. Those skilled in the art and having the benefit of this disclosure will recognize that exposure of the top metal 104 may be achieved by single step process or a multiple step process in order to reduce the amount of damage that may occur to metal 104 during planarization. Alternately, the planarization process may be stopped at capping layer 103. This would leave the top surface of the metal covered by layer 103. Those skilled in the art and having the benefit of this disclosure will recognize that openings in layer 103 would then need to be formed in those instances where a via is to make electrical contact with metal 104.

Figure 7:
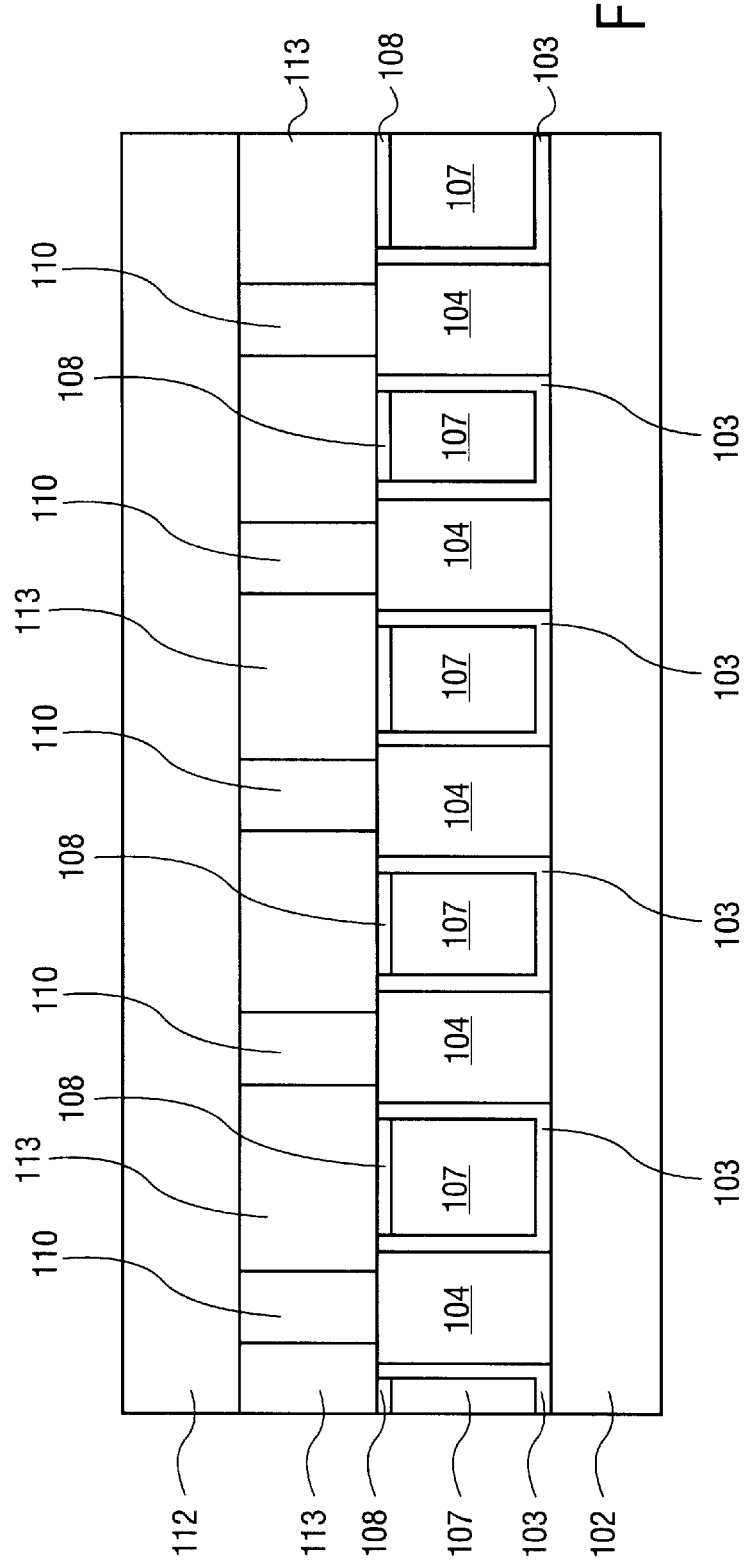
FIG. 7 is a schematic cross-section of the structure of FIG. 6 with an interlayer dielectric formed over the planarized surface, and vias formed though the interlayer dielectric to connect two layers of interconnect, in accordance with the present invention.

After the encapsulated low-k dielectric structure, as shown in FIG. 6, is formed, an interlayer dielectric layer, vias, and upper level metallization are formed as shown in FIG. 7. More particularly, FIG. 7 shows an interlayer dielectric 113 that is formed over the planarized surface of interconnect lines 104 and capping layer 108. Subsequently, via openings are formed in interlayer dielectric 113, and then filled to form vias 110. Metal layer 112 is formed and patterned over the surface of interlayer dielectric 113 and vias 110.

FIG. 7 shows, in schematic cross-section, the structure of FIG. 6 after further processing to form an interlayer dielectric, vias, and an upper level of patterned interconnect. The formation of these superjacent layers is compatible with the intralayer dielectric structure of the present invention. Furthermore, capping layer 108 prevents misalignment of the via opening from resulting in exposure of the topside of low-k dielectric 107. In other words, an unlanded via structure, whether intended by design, or resulting from misalignment or overetching, will not typically expose the topside surface of low-k dielectric 107 because of the presence of capping layer 108.

An alternative embodiment of the present invention is described below in conjunction with FIGS. 8–9. This embodiment differs from the embodiment described above in that a hardmask layer remains over the interconnect lines. By effectively increasing the height the interconnect lines In this way, the thickness of the low-k dielectric material disposed therebetween is also increased. This is useful for further reducing parasitic capacitance because the low-k material is now further interposed between each of the interconnect lines, both of the same interconnect level and the interconnect levels that may be formed above them.

Referring to FIG. 8, a process of forming a low dielectric constant intralayer insulating film having a capping layer in accordance with the present invention is described. Interconnect lines 104 are formed by patterning a conductive layer that has been disposed upon a substrate 102. Interconnect lines 104 have a hardmask layer 114 disposed upon the top surface thereof, and hardmask layer 114 is not removed. Hardmask layer 114 can be a silicon oxynitride layer approximately 50 nm to approximately 100 nm thick. Well-known masking and etching methods are used to pattern the hardmask and conductive layers so as to form conductive interconnect lines having topsides covered with the patterned oxynitride.

After hardmask 114 and interconnect lines 104 are patterned, a liner layer 103 is then formed over the sidewalls of interconnect lines 104 and hardmask layer 114, and the topside surfaces of hardmask layer 114, and over the exposed portions of the underlying substrate 102. Liner 103 may be formed by depositing a material such as, but not limited to, silicon nitride, silicon dioxide, SiC, a-CN, or a combination thereof. A high density plasma chemical vapor deposition of fluorinated amorphous carbon is then performed to form an a-F:C layer 107. Note that the thickness of layer 107 in FIG. 8 is such that its top surface is a greater distance from the substrate than that of the top surface of interconnect lines 104. This is advantageous in reducing parasitic capacitance, as it allows for a greater amount of low-k dielectric material to be disposed between interconnect lines 104 and similar interconnect lines that are subsequently formed on upper layers of an integrated circuit. An in-situ deposition of a capping layer 108 is then performed. By preventing exposure of layer 107 to the atmosphere prior to deposition of capping layer 108, it is possible to substantially eliminate interaction of layer 107 with moisture.

The structure of FIG. 8 is subjected to a planarization operation to produce the structure shown in FIG. 9. As can be seen in FIG. 9, the intralayer dielectric structure includes low-k dielectric 107, liner 103, which encapsulates the bottom and vertical side surfaces of low-k dielectric 107, and capping layer 108 which encapsulates the top surface of low-k dielectric 107. Comparing the structure of FIG. 9 to the structure of FIG. 6, it can be seen that hardmask 114 serves to increase the height of the gap between interconnect lines so that a greater amount of low-k dielectric material can be disposed there.

The structure of FIG. 9 is then subjected to further processing steps, such as those described above in connection with FIG. 7, to form an interlayer dielectric, vias, and upper level interconnect.

Figure 12:
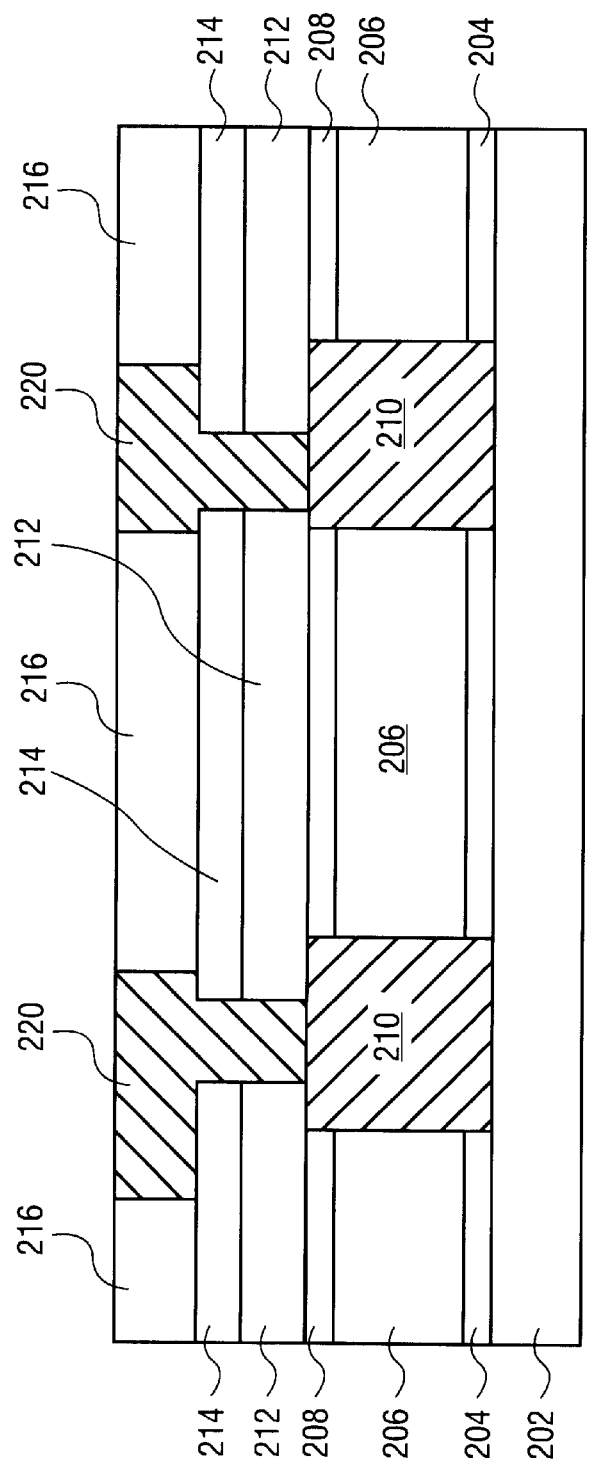
FIG. 12 is a schematic cross-section of the structure of FIG. 11 after an interlayer dielectric structure, including an etch stop, has been formed and patterned to receive metal for vias and a second level of interconnect, in accordance with the present invention.

A further alternative embodiment is described in conjunction with FIGS. 10–12. The embodiment described in conjunction with FIGS. 10–12 involves providing an encapsulated low-k dielectric material, such as an amorphous fluorinated carbon, as an interlayer dielectric for interconnect lines formed by a damascene process.

Referring to FIG. 10, a schematic cross-section of a partially processed wafer is shown in which there is an insulating substrate layer 202, a patterned liner layer 204, a patterned low-k dielectric layer 206, a patterned capping layer 208, and openings 209 formed by the patterning of liner layer 204, low-k dielectric layer 206, and capping layer 208. Those skilled in the art will appreciate that insulating substrate layer 202 typically has one or more layers formed subjacent thereto, those layers typically including, but not limited to, a semiconductor substrate and various patterns of impurity doping.

Liner layer 204 may be formed of a material such as, but not limited to, silicon nitride. Low-k dielectric layer 206 may be formed from a material such as, but not limited to, an a-F:C. Low-k dielectric layer 206 may optionally be annealed, prior to forming capping layer 208. Capping layer 208, may be formed from a material such as, but not limited to silicon nitride. Capping layer 208 is formed insitu, that is, it is formed after formation of low-k dielectric layer 206 but before the wafer is exposed to the atmosphere. Typically this is done by depositing capping layer 208 in the same reaction chamber in which low-k dielectric layer 206 is formed. Alternatively, capping layer 208 may be formed in a different reaction chamber from the one in which low-k dielectric layer 206 is formed, so long as the vacuum is not broken.

By forming capping layer 208 in-situ, moisture is substantially prevented from interacting with low-k dielectric layer 206. Similarly outgassing from low-k dielectric layer 206 is substantially prevented by the presence of capping layer 208. When openings 209 are formed by the patterning of liner layer 204, low-k dielectric layer 206, and capping layer 208, some portions of low-k dielectric layer 206 are exposed as can be seen in FIG. 10. The exposed sidewall portions of low-k dielectric layer 206 in openings 209 do not present a substantial moisture absorption problem because of the relatively small amount of surface area that is exposed. In this case, an in situ degas or a reactive pre-clean (such as with forming gas or $H_2$) prior to Cu barrier or Cu seed depositions can be used to address moisture uptake or outgassing.

FIG. 11 shows, in schematic cross-section, the structure of FIG. 10 after a conductive layer has been deposited and polished back to form interconnect lines 210. As can be seen in FIG. 11, interconnect lines 210 occupy the former openings 209.

FIG. 12 shows, in schematic cross-section, the structure of FIG. 11 after further processing to form an interlayer dielectric, vias, and an upper level of patterned interconnect. The formation of these superjacent layers is compatible with the intralayer dielectric structure of the present invention. Furthermore, capping layer 208 prevents misalignment of the via opening from resulting in exposure of the topside of low-k dielectric 206. In other words, an unlanded via structure, whether intended by design, or resulting from misalignment or overetching, will not expose the topside surface of low-k dielectric 206 because of the presence of capping layer 208.

The structure of FIG. 12 includes an interlayer dielectric 212 formed over capping layer 208 and interconnect lines 210, and an etch stop layer 214 formed over interlayer dielectric 212. Interlayer dielectric 212, and etch stop layer 214 are patterned to form via openings which are subsequently substantially filled with at least one conductive material. Those skilled in the art will appreciate that via openings may be filled with one conductive material, with an alloy of two or more conductive materials, may alternatively include a Cu barrier, an adhesion layer, or various other combinations known in the art, or any other equivalent form creating a conductive pathway through the via opening. An intralayer dielectric 216 is then typically formed over etch stop 214 and the vias. Intralayer dielectric 216 is then patterned and interconnect lines 220 are formed by known damascene processing operations.

In one embodiment, Cu barrier/seed layers are deposited, typically a thin layer of Ta, TaN or TiN as the barrier layer (10 nm–30 nm), and then a thin layer of Cu (80 nm–250 nm) as the seed layer, prior to a Cu electroplate operation being performed.

Figure 13:
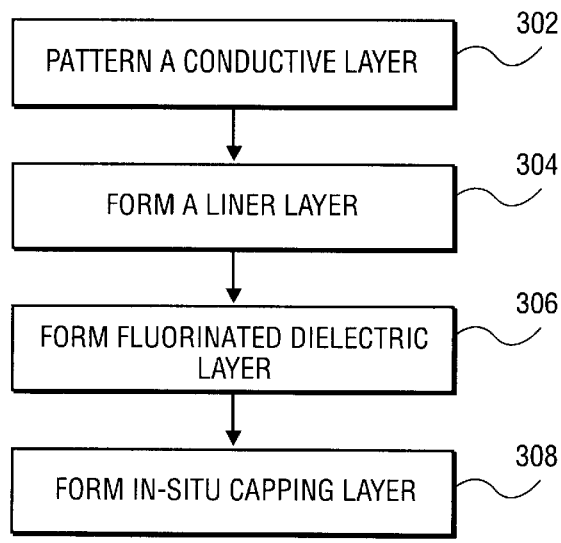
FIG. 13 is a flow diagram illustrating a process in accordance with the present invention.
Figure 14:
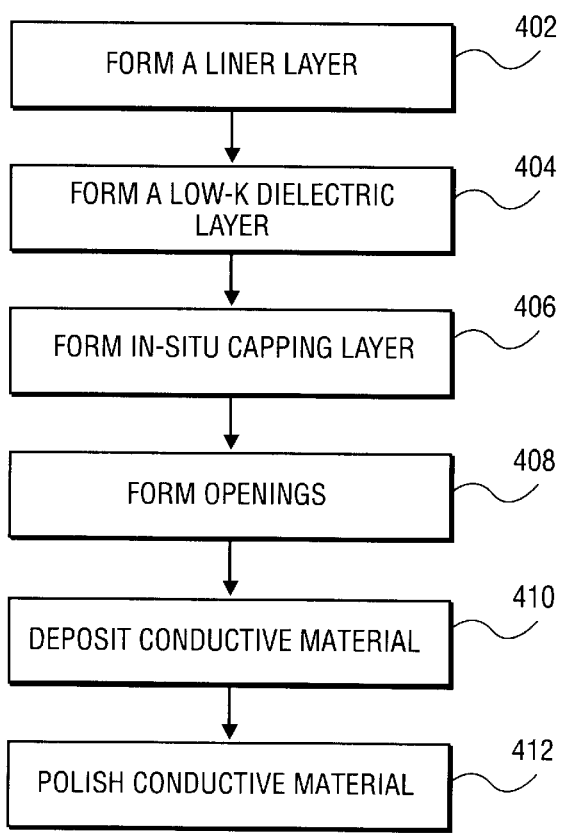
FIG. 14 is a flow diagram illustrating an alternative process in accordance with the present invention.

FIGS. 13–14 are flow diagrams showing processes in accordance with the present invention. FIG. 13 illustrates a method of forming an encapsulated fluorinated dielectric material in a subtractive metal scheme. FIG. 14 illustrates a method of forming an encapsulated fluorinated dielectric material in a damascene metal process.

Referring now to FIG. 13, a process 300 includes patterning 302 a conductive layer that has been formed on an insulating substrate. Patterning of conductive materials, such as metals, is well known in the art. Such patterning is used to form interconnect lines from a blanket layer of conductive material. Subsequent to formation of the interconnect lines, a liner layer is formed 304. The liner layer is useful in containing outgassing from the fluorinated dielectric material that will subsequently be deposited. The liner covers the sidewalls and top surface of the interconnect lines. Those skilled in the art and having the benefit of this disclosure will appreciate that the interconnect lines may alternatively be formed such that a hardmask layer remains in place over the top surface of the interconnect lines and that a liner layer may, in this alternative process cover the top surface of the hardmask.

After the liner is formed, a fluorinated dielectric material is deposited 306. In the illustrated embodiment, the fluorinated dielectric material is a fluorinated amorphous carbon. Typically the substrate is placed into a reaction chamber and heated to temperature in the range of approximately 300–450° C. A high density plasma chemical vapor deposition of fluorinated amorphous carbon is then performed. In this illustrative embodiment of the present invention, a high density plasma is a plasma having a density of approximately $10^{13}$–$10^{14}$ ions per square centimeter. Conditions for the HDP CVD are, an rf bias in the range of 0 to 2 kW applied to the substrate, a plasma power (microwave or rf) in the range of approximately 2 to 5 kW to create the plasma, and at least one fluorocarbon introduced into the reaction chamber between the plasma and the substrate.

Optionally, after the formation of the fluorinated amorphous carbon an anneal is performed in the range of approximately 400° C. to approximately 425° C. Those skilled in the art having the benefit of this disclosure will appreciate that specific choices of temperatures and times for the annealing will depend, to some extent, on the overall thermal budget for a particular semiconductor manufacturing process.

Subsequent to the anneal, if performed, an in-situ deposition 308 of capping layer is performed. Such a layer is typically comprised of a material such as, but not limited to, silicon dioxide, silicon oxynitride or silicon nitride, SiC, a-CN, or a combination of these materials.

Referring now to FIG. 14, a process 400 includes forming a liner layer 402 on an insulating substrate. Those skilled in the art will recognize that such a substrate may be a silicon wafer that has been processed to include various electrical components and interconnections, and further processed to include an overlying insulating layer. A low-k dielectric layer is then formed 404 over the liner layer. Subsequent to the formation of the low-k dielectric layer, an in-situ deposition 406 of a capping layer is performed. The in-situ deposition is typically performed in the same reaction chamber in which the formation of the low-k dielectric layer takes place. Alternatively, the in-situ deposition of the capping layer may take place in a different reaction chamber as long as the low-k dielectric chamber is not exposed to the atmosphere while it is transferred to another reaction chamber.

After the formation of the capping layer, the liner, low-k, and capping layers are patterned 408 to form openings. Subsequently, a layer of conductive material, such as, including but not limited to, a metal, or an alloy of metals, is deposited 410 over the surface of the wafer. The conductive layer is polished back 412 to the extent that the conductive material remains in the openings and is otherwise removed. In this way interconnect lines are formed.

Conclusion

The use of an effective capping layer for low-k a-F:C and a-F:C:H dielectric films allows integration of low k materials.

Embodiments of the present invention provide, low dielectric constant intralayer insulators on integrated circuits.

An advantage of embodiments of the present invention is that outgassing from the low-k dielectric materials is substantially reduced.

A further advantage of embodiments of the present invention is that moisture is substantially prevented from reaching the low-k dielectric material and combining therewith to form corrosive compounds.

The present invention may be implemented with various changes and substitutions to the illustrated embodiments. For example, the present invention may be implemented on substrates comprised of materials other that silicon, such as, for example, gallium arsenide or sapphire. Additionally, illustrative embodiments describe amorphous fluorinated carbon, however the present invention may be practiced with other low-k dielectric materials.

It will be readily understood by those skilled in the art that various other changes in the details, materials, and arrangements of the parts and operations which have been described and illustrated in order to explain the nature of this invention may be made without departing from the principles and scope of the invention as expressed in the subjoined Claims.

What is claimed is:

1. A structure, comprising:

a plurality of patterned, space apart, conductive lines on an insulating substrate;

a liner layer covering sidewalls of the conductive lines and the insulating substrate therebetween;

a hardmask layer disposed over the conductive lines;

an amorphous fluorinated material disposed between the conductive lines to a level below an upper surface of the hardmask layer and above upper surfaces of the conductive lines; and a capping layer disposed in-situ completely over the amorphous fluorinated material, said capping layer comprising a material selected from a group consisting of SiC and amorphous CN having an upper surface;

wherein the an upper surface of the capping layer is approximately flush with the upper surface of the hardmask layer.

2. The structure of claim 1, wherein the capping layer comprises a hardmask.

3. The structure of claim 1, wherein the conductive lines comprise metal, the liner comprises silicon nitride, and the capping layer comprises silicon dioxide.

4. The structure of claim 1, wherein the liner comprises a material selected for the group consisting of silicon nitride, silicon dioxide, silicon oxynitride, SiC and amorphorous 3 CN.

5. The structure of claim 1, wherein the amorphous fluorinated material comprises amorphous fluorinated carbon (a-F:C).

6. The structure of claim 1, wherein the amorphous fluorinated material comprises amorphous fluorinated hydrocarbon (a-F:C:H).

7. The structure of claim 1, wherein the capping layer comprises a moisture barrier.

8. The structure of claim 1, wherein the capping layer comprises dielectric.

9. The structure of claim 2, wherein the capping layer comprises silicon dioxide.

\* \* \* \* \*